(12) United States Patent
Bilenko et al.

(10) Patent No.: US 12,300,773 B2
(45) Date of Patent: May 13, 2025

(54) LIGHT-EMITTING DEVICE PACKAGE AND MANUFACTURING METHOD THEREFOR

(71) Applicant: SEOUL VIOSYS CO., LTD., Gyeonggi-do (KR)

(72) Inventors: Yuriy Bilenko, Gyeonggi-do (KR); Ki Yon Park, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 1027 days.

(21) Appl. No.: 17/113,448

(22) Filed: Dec. 7, 2020

(65) Prior Publication Data

US 2021/0091278 A1    Mar. 25, 2021

Related U.S. Application Data

(63) Continuation of application No. PCT/KR2019/006930, filed on Jun. 10, 2019.

(30) Foreign Application Priority Data

Jun. 8, 2018  (KR) .......................... 10-2018-0065751

(51) Int. Cl.
*H01L 33/60* (2010.01)
*H01L 33/48* (2010.01)
*H01L 33/58* (2010.01)

(52) U.S. Cl.
CPC ............ *H01L 33/60* (2013.01); *H01L 33/486* (2013.01); *H01L 33/58* (2013.01); *H01L 2933/0058* (2013.01)

(58) Field of Classification Search
CPC .............................. H01L 33/486; H01L 33/60
See application file for complete search history.

(56) References Cited

U.S. PATENT DOCUMENTS

| | | | |
|---|---|---|---|
| 9,664,342 B2 | 5/2017 | Kaiser et al. | |
| 2005/0213320 A1 | 9/2005 | Kazuhiro et al. | |
| 2006/0102917 A1 | 5/2006 | Oyama et al. | |
| 2007/0187706 A1 | 8/2007 | Higashi et al. | |
| 2010/0181582 A1* | 7/2010 | Li | H01L 33/54 |
| | | | 257/E33.056 |

(Continued)

FOREIGN PATENT DOCUMENTS

| JP | S60063970 U | 4/1985 |
|---|---|---|
| JP | 2006049624 A | 2/2006 |

(Continued)

OTHER PUBLICATIONS

Examination report for Indian Patent Application No. 202138061847, Sep. 27, 2022, 7 pages.

(Continued)

*Primary Examiner* — Mark W Tornow
(74) *Attorney, Agent, or Firm* — LaBatt, LLC

(57) ABSTRACT

A light-emitting device package includes a substrate having a mounting region in which a light-emitting device chip is mounted. The light-emitting device package further includes a reflector and a cover enclosing the reflector. The reflector is disposed around the light-emitting device chip and having an opening through which the mounting region of the substrate is exposed. The reflector has elasticity to allow variation of a diameter thereof.

20 Claims, 7 Drawing Sheets

(56) References Cited

U.S. PATENT DOCUMENTS

| | | | | |
|---|---|---|---|---|
| 2011/0127546 | A1* | 6/2011 | Jaus | H01L 31/054 |
| | | | | 257/432 |
| 2016/0163935 | A1* | 6/2016 | Yap | H01L 33/54 |
| | | | | 257/98 |
| 2016/0320689 | A1* | 11/2016 | Butterworth | G03B 15/05 |
| 2019/0044035 | A1 | 2/2019 | Nishimiya et al. | |

FOREIGN PATENT DOCUMENTS

| | | |
|---|---|---|
| JP | 2007067449 A | 3/2007 |
| JP | 2007220852 A | 8/2007 |
| JP | 2007227480 A1 | 9/2007 |
| JP | 2008-288394 | 11/2008 |
| JP | 2017503352 A | 1/2017 |
| KR | 100643919 B1 | 11/2006 |
| KR | 10-1201307 | 11/2012 |
| KR | 10-1505654 | 3/2015 |
| KR | 10-2016-0088674 | 7/2016 |
| KR | 1020180009720 A | 1/2018 |
| TW | I427757 B | 2/2014 |
| WO | 2007074983 A1 | 7/2007 |
| WO | 2014115202 A1 | 7/2014 |
| WO | 2017217028 A1 | 3/2017 |

OTHER PUBLICATIONS

Office Action for Japanese Patent Application No. 2020-568305 with English translation, Apr. 4, 2023, 10 pages.

International Search Report issued in International Application PCT/KR2019/006930, mailed Sep. 17, 2019.

Extended European Search Report for European Application No. 19815307.4, issued Feb. 4, 2022, 8 pages.

Office Action for Japanese Patent Application No. 2020-568305 with English translation, Sep. 26, 2023, 12 pages.

English translation of Office Action for Korean Patent Application No. 10-2018-0065751, Dec. 9, 2022, 7 pages.

Office Action for Japanese Patent Application No. 2020-568305 (no English translation available), Apr. 2, 2024, 4 pages.

* cited by examiner

LIGHT-EMITTING DEVICE PACKAGE AND MANUFACTURING METHOD THEREFOR

CROSS-REFERENCE TO RELATED APPLICATIONS AND PRIORITY

The present application is a continuation of International Application No. PCT/KR2019/006930, filed on Jun. 10, 2019, which claims priority to and the benefit of Korean Patent Application No. 10-2018-0065751, filed on Jun. 8, 2018, the disclosures of which are incorporated herein by their entirety.

TECHNICAL FIELD

Embodiments of the present disclosure relate to a light-emitting device package and a method of manufacturing the same.

BACKGROUND

A light emitting diode is a semiconductor device that emits light through recombination of electrons and holes in a P-N semiconductor junction structure upon application of electric current thereto. A light emitting apparatus using such a light emitting diode has various advantages, such as cost effectiveness and affordability, low voltage, long lifespan, low price, and the like.

Conventionally, light emitting diodes are applied to display lamps or for display of simple data, such as numerals and the like. In recent years, with the development of industrial technology, particularly information display technology and semiconductor technology, light emitting diodes have been applied to various fields including displays, lighting, vehicular lamps, projectors, and the like. In addition, light emitting diodes are used for outdoor installations, such as street lamps and traffic lights. Accordingly, there is a need for a light emitting diode having a more durable structure for outdoor installations that can be exposed to more severe environments.

SUMMARY

Embodiments of the present disclosure provide a light-emitting device package having a highly durable structure obtained through stable and firm assembly of each component.

In accordance with embodiments of the present disclosure, a light-emitting device package includes: a substrate having a mounting region in which a light-emitting diode chip is mounted; the light-emitting diode chip being mounted in the mounting region on the substrate; a reflector disposed around the light-emitting diode chip and having an opening through which the mounting region of the substrate is exposed, the reflector having elasticity to allow variation of a diameter thereof; and a cover enclosing the reflector.

In at least one variant, an inner surface of the reflector defining the opening of the reflector may be an inclined surface.

In another variant, the opening of the reflector may have a width gradually increasing upwards from a surface of the substrate.

The inner surface of the reflector defining the opening of the reflector may have a parabolic cross-section.

The light-emitting diode chip may be disposed at a focal point of the parabolic cross-section.

In further another variant, the reflector may have a ring shape in plan view. The reflector may be provided at one side thereof with a slit formed by removing a portion of the reflector and may be divided by the slit to have both ends facing each other. The slit may be placed on a line passing through a center of the ring or may be slanted with respect to the line. The reflector may have an outer wall contacting an inner surface of the cover.

In yet another variant, an outer diameter of the reflector may be the same as an inner diameter of the cover.

The outer wall of the reflector may be fastened to the inner surface of the cover.

The outer wall of the reflector and the inner surface of the cover may have threads engaging with each other.

In at least one variant, the reflector may be formed of a metal. The light-emitting device package may further include a reflective film formed on an inner surface of the reflector. The reflector may be formed of a metal, a ceramic material or an organic polymer. The light-emitting device package may further include a window connected to the cover and allowing light emitted from the light-emitting diode chip to pass therethrough. The window may cover the opening of the reflector. Alternatively, the window may fill the opening of the reflector.

The light-emitting device package having the above structure may be manufactured by mounting a light-emitting diode chip on a substrate, preparing a cover, mounting the cover on the circumference of the reflector, and connecting the cover to the substrate, with the reflector inserted into the cover.

In another variant, the reflector may be partially removed to form a slit imparting elasticity to the reflector and an outer diameter of the reflector may be adjusted by the slit. In further another variant, the reflector may be inserted into the cover in a state in which the reflector is adjusted to have an outer diameter that is the same as or smaller than an inner diameter of the cover. In yet another variant, manufacture of the light-emitting device package may further include mounting a window on the cover.

In at least one variant, the light-emitting device package may be employed by a light irradiation apparatus. The light irradiation apparatus may include at least one light-emitting device package, and a main body on which the at least one light-emitting device package is mounted.

Embodiments of the present disclosure provide a light-emitting device package having a highly durable structure through stable and firm assembly of each component.

DESCRIPTION OF DRAWINGS

FIG. 4A illustrates assembling a reflector and a cover;

FIG. 4B illustrates mounting an assembly of the reflector and the cover on a substrate having a light-emitting diode chip; and FIG. 4C illustrates sealing a gap between the cover and the substrate.

DETAILED DESCRIPTION OF EMBODIMENTS

The present disclosure may be implemented in various ways and certain embodiments will be described in detail with reference to the accompanying drawings. However, it should be understood that the present disclosure is not limited to the following embodiments and includes all modifications, variations, alterations, and equivalents within the spirit and scope of the present disclosure.

Hereinafter, embodiments of the present disclosure will be described in detail with reference to the accompanying drawings.

Figure 1:
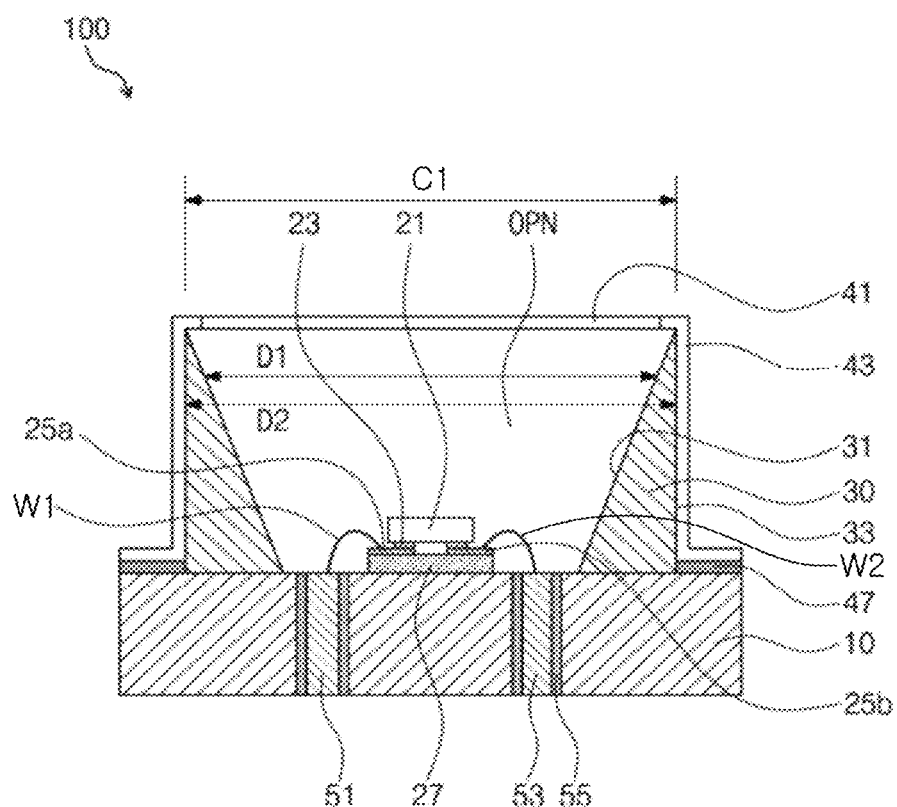
FIG. 1 is a sectional view of a light-emitting device package according to one embodiment of the present disclosure.
Figure 2:
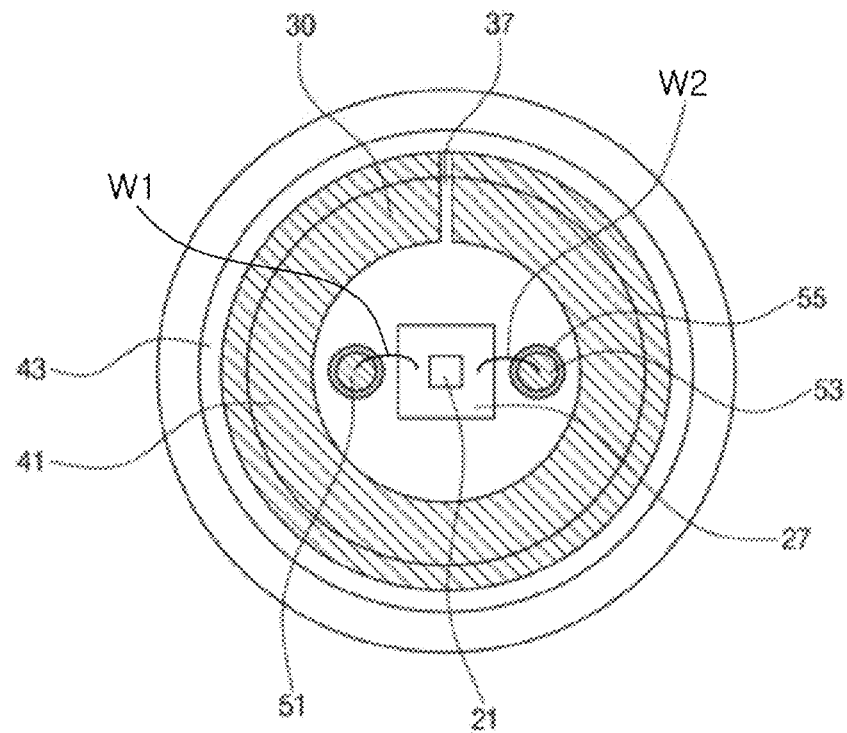
FIG. 2 is a plan view of the light-emitting device package according to the embodiment of the present disclosure.

FIG. 1 is a sectional view of a light-emitting device package according to one embodiment of the present disclosure and FIG. 2 is a plan view of the light-emitting device package according to the embodiment of the present disclosure.

Referring to FIG. 1 and FIG. 2, a light-emitting device package 100 according to one embodiment of the present disclosure is a light source employed by various apparatuses through surface mounting and includes a light-emitting diode chip 21 adapted to emit light. More specifically, the light-emitting device package 100 according to the embodiment includes a substrate 10 on which the light-emitting diode chip 21 is mounted, a reflector 30 and a cover 43. The light-emitting diode chip 21 is mounted on the substrate 10. The reflector 30 reflects light emitted from the light-emitting diode chip 21, and the cover 43 is fastened to the reflector 30 while surrounding the circumference of the reflector 30.

The substrate 10 has a mounting region and allows at least one light-emitting diode chip 21 to be mounted thereon.

The substrate 10 may have various shapes to allow the light-emitting diode chip 21 to be mounted thereon. By way of example, the substrate 10 may be provided in a plate shape having a substantially circular shape in plan view and a predetermined height. However, the substrate 10 is not limited thereto and may have an elliptical shape or a rectangular shape.

The substrate 10 may be at least partially formed of a material having high thermal conductivity. The substrate 10 may be formed of, for example, a metal selected from among copper, iron, nickel, chromium, aluminum, silver, gold, titanium, or an alloy thereof. However, it should be understood that the substrate 10 is not limited thereto and may be formed of a non-conductive material. For the substrate 10 formed of the non-conductive material, a conductor may be disposed on an upper surface of the substrate 10. The non-conductive material may include ceramic materials, resins, glass, and composites thereof (for example, a composite resin or a mixture of a composite resin and a conductive material).

In the embodiment, the substrate 10 may be provided as a monolithic structure, without being limited thereto. Alternatively, the substrate 10 may be provided in the form of a combination of multiple sub-substrates 10.

The substrate 10 is provided with a terminal unit for supplying electric power to the light-emitting diode chip 21. The terminal unit may include a first terminal 51 and a second terminal 53 connected to a cathode and an anode of the light-emitting diode chip 21, respectively.

In the embodiment, the first and second terminals 51, 53 may be provided in the form of pins penetrating the upper and lower surfaces of the substrate 10. The first and second terminals 51, 53 may have a longer length than a thickness of the substrate 10 and may extend to a lower end of the substrate 10. Each of the first and second terminals 51, 53 may be formed of a conductive material, for example, a metal. Although an upper end of each of the first and second terminals 51, 53 is flush with an upper end of the substrate 10 in this embodiment, it should be understood that this structure is provided for convenience of description and the first and second terminals may be arranged in a different way. For example, the upper ends of the first and second terminals 51, 53 may protrude from the upper surface of the substrate 10. Although not shown in the drawings, each of the first and second terminals 51, 53 may be provided at an upper portion thereof with a pad having a relatively large area to facilitate connection to the light-emitting diode chip 21. In addition, although each of the first and second terminals 51, 53 extends to the lower surface of the substrate 10 in this embodiment, it should be understood that other implementations are possible. Alternatively, the first and second terminals 51, 53 may extend towards a side surface of the substrate 10.

In the embodiment, an insulator 55 may be disposed between the terminal unit and the substrate 10. That is, the insulator 55 may be disposed between the substrate 10 and the first terminal 51 and between the substrate 10 and the second terminal 53 to surround the first terminal 51 and the second terminal 53. The insulator 55 insulates the first and second terminals 51, 53 from the substrate 10.

In the embodiment, since the substrate 10 formed of a non-conductive material, for example, a ceramic material, is an insulator, the insulator 55 may be omitted and the substrate 10 may contact the first terminal 51 and the second terminal 53.

The light-emitting diode chip 21 is mounted in the mounting region on the substrate 10. The light-emitting diode chip 21 may be directly mounted on the substrate 10 or may be disposed on the substrate 10 via a sub-mount 27 as shown in FIG. 1. In one embodiment, with the light-emitting diode chip 21 disposed on the sub-mount 27, the sub-mount 27 is mounted on the substrate 10.

Although one light-emitting diode chip 21 is mounted on the substrate 10 in this embodiment, it should be understood that other implementations are possible. Two or more light-emitting diode chip 21 may be disposed thereon, as needed.

In this embodiment, the light-emitting diode chip 21 may be a flip-chip type. However, it should be understood that the light-emitting diode chip 21 is not limited thereto and various types of light-emitting diode chips including a lateral type and a vertical type may be provided as the light-emitting diode chip 21.

Although not shown in the drawings, the light-emitting diode chip 21 may include a light emitting structure and electrodes formed on a base substrate.

The base substrate may be, for example, a sapphire substrate, particularly a patterned sapphire substrate. Preferably, the base substrate is an insulating substrate, without being limited thereto.

The light emitting structure may include a first semiconductor layer, an active layer, and a second semiconductor layer.

The first semiconductor layer may be a semiconductor layer doped with a first conductivity type dopant. The first conductivity type dopant may be an n-type dopant. The first conductivity type dopant may be Si, Ge, Se, Te, or C. In one embodiment, the first semiconductor layer may include a nitride-based semiconductor material. For example, the first semiconductor layer may be formed of a semiconductor material having a composition represented by $In_xAl_yGa1-x-yN$ ($0 \leq x \leq 1$, $0 \leq y \leq 1$, $0 \leq x+y \leq 1$). In some embodiments, the semiconductor material having this composition may include GaN, AlN, AlGaN, InGaN, InN, InAlGaN, AlInN, and the like. The first semiconductor layer may be formed by growing the semiconductor material so as to contain the n-type dopant, such as Si, Ge, Sn, Se, Te, and the like.

The active layer is formed on the first semiconductor layer and corresponds to a light emitting layer. The active layer refers to a layer in which electrons (or holes) injected through the first semiconductor layer recombine with holes (or electrons) injected through the second semiconductor layer to emit layer generated by an energy band gap depending upon materials of the active layer. The active layer may emit light having at least one peak wavelength selected from UV light, blue light, green light and red light.

The active layer may be realized by compound semiconductors. The active layer may be realized by, for example, at least one of group III-V or II-VI compound semiconductors, and may have a composition represented by $In_xAl_yGa_{1-x-y}N$ ($0 \leq x \leq 1$, $0 \leq y \leq 1$, $0 \leq x+y \leq 1$).

The second semiconductor layer is formed on the active layer. The second semiconductor layer is a semiconductor layer having a second conductivity type dopant having an opposite polarity to the first conductivity type dopant. The second conductivity type dopant may be a p-type dopant. The conductivity type dopant may include, for example, Mg, Zn, Ca, Sr, Ba, and the like. In one embodiment, the second semiconductor layer may include a nitride-based semiconductor material. For example, the second semiconductor layer may be formed of a semiconductor material having a composition represented by $In_xAlyGa_{1-x-y}N$ ($0 \leq x \leq 1$, $0 \leq y \leq 1$, $0 \leq x+y \leq 1$). In some embodiments, the semiconductor material having this composition may include GaN, AlN, AlGaN, InGaN, InN, InAlGaN, AlInN, and the like. The second semiconductor layer may be formed by growing the semiconductor material so as to contain the p-type dopant, such as Mg, Zn, Ca, Sr, Ba, and the like.

In this embodiment, an insulating layer is formed on each of the first semiconductor layer and the second semiconductor layer, and a cathode and an anode are formed on the insulating layers to be connected to the first semiconductor layer and the second semiconductor layer through the insulating layers disposed therebetween, respectively.

In some embodiments, the sub-mount 27 may be disposed between the substrate 10 and the light-emitting diode chip 21 to be placed under the light-emitting diode chip 21 such that the light-emitting diode chip 21 can be electrically connected to the terminal unit of the substrate 10 by the sub-mount 27.

The sub-mount 27 may be formed of a material having high thermal conductivity to allow heat generated from the light-emitting diode chip 21 to be effectively discharged therethrough. For example, the sub-mount 27 may be formed of a ceramic material, such as AlN.

First and second pads 25a, 25b may be disposed on an upper surface of the sub-mount 27 to be electrically connected to the light-emitting diode chip 21. The first and second pads 25a, 25b may be connected to the cathode and the anode of the light-emitting diode chip 21 through a conductive bonding member 23, respectively. The first and second pads 25a, 25b may be connected to the first and second terminals 51, 53 by wire bonding, respectively, whereby the cathode of the light-emitting diode chip 21 is connected to the first pad 25a through the conductive bonding member 23 and the first pad 25a is connected to the first terminal 51 through a wire W1, as shown in FIG. 1. The anode of the light-emitting diode chip 21 is connected to the second pad 25b through the conductive bonding member 23 and the second pad 25b is connected to the second terminal 53 through a wire W2. Accordingly, electric power can be applied to the light-emitting diode chip 21 through the terminal unit.

Here, the conductive bonding member 23 may be realized by conductive pastes, such as solder pastes, silver pastes, and the like, or by a conductive resin. Alternatively, the conductive bonding member 23 may be realized by an anisotropic conductive film.

The shape of the sub-mount 27 may be modified in various ways so long as the sub-mount 27 can electrically connect the light-emitting diode chip 21 to the terminal unit of the substrate 10 as needed. Alternatively, the sub-mount 27 may be omitted. In a structure where the sub-mount 27 is omitted, the light-emitting diode chip 21 may have a chip-on-board structure in which the light-emitting diode chip 21 is directly mounted on the substrate 10.

The reflector 30 is disposed along the circumference of the mounting region on the substrate 10. The reflector 30 reflects light emitted from the light-emitting diode chip 21 such that the light travels in an upward direction.

The reflector 30 is disposed around the light-emitting diode chip 21 and has an opening OPN through which the mounting region of the substrate 10 is exposed. That is, the reflector 30 is provided in a ring shape open at upper and lower portions thereof on the substrate 10. The reflector 30 may have a shape corresponding to the shape of the substrate 10 and may have a circular ring shape in plan view. However, it should be understood that the reflector 30 is not limited thereto and may be provided in an elliptical shape, a rectangular shape, or the like, and may have a different shape than that of the substrate 10.

The mounting region of the substrate 10 is exposed through the opening OPN of the reflector 30. The light-emitting diode chip 21 may be disposed at a location on the substrate 10 at which the opening OPN of the reflector 30 is disposed. When the reflector 30 has a circular ring shape, the light-emitting diode chip 21 may be placed in a region corresponding to the center of the circle defined by the reflector 30 so as to maximize reflectivity of light.

In this embodiment, the reflector 30 includes an inner surface 31 facing the opening OPN, an outer surface 33 facing outwards, and a lower surface adjoining the upper surface of the substrate 10. In one embodiment, the reflector 30 may have a substantially right-angled triangular cross-section and the inner surface 31 of the reflector 30 may correspond to an oblique side of the right-angled triangular cross-section. However, it should be understood that the reflector 30 is not limited thereto and may have an inner surface 31, an outer surface 33, a lower surface, and an upper surface opposite to the lower surface and having a narrower area than the lower surface. In this case, the reflector 30 may have a substantially trapezoidal cross-section and the inner surface 31 of the reflector 30 may correspond to an oblique side of the trapezoidal cross-section, as shown in FIG. 1.

In the embodiment, the inner surface 31 is at least partially slanted with respect to the upper surface of the substrate 10. Accordingly, the opening OPN of the reflector 30 has a width gradually increasing upwards from the upper surface of the substrate 10. In other words, an inner diameter D1 of the reflector 30 gradually increases upwards from the upper surface of the substrate 10. The outer surface 33 of the reflector 30 may be disposed at a right angle with respect to the upper surface of the substrate 10, whereby an outer diameter D2 of the reflector 30 mounted on the cover 43 can be kept substantially constant without increasing or decreasing upwards from the upper surface of the substrate 10. However, it should be understood that the outer diameter D2 of the reflector 30 is not limited thereto and may be changed to allow easy fastening of the reflector 30 to the cover 43.

A bonding agent may be disposed between the substrate 10 and the reflector 30 to bond the substrate 10 to the reflector 30. Alternatively, the substrate 10 may be connected to the reflector 30 by a separate fastening member, such as a hook. However, it should be understood that other implementations are possible and the bonding agent between the substrate 10 and the reflector 30 may be omitted.

The reflector 30 may be formed of a highly reflective material in order to maximize efficiency in extracting light from the light-emitting diode chip 21.

For example, the reflector 30 may be formed of aluminum and/or an aluminum alloy. Alternatively, the reflector 30 may be formed of other materials having high reflectivity, for example, various metals, such as silver, gold, tin, copper, chromium, nickel, molybdenum, titanium, and the like, and alloys thereof. Further, the reflector 30 may be formed of a material having high reflectivity depending upon the wavelength of light emitted from the light-emitting diode chip 21. For example, silver (Ag) has low light reflectivity in a certain UV wavelength band, and silver may not be used as the material for the reflector 30 for the light-emitting diode chip 21 adapted to emit UV light.

In other embodiments, the reflector 30 may be formed of a reflective material excluding metals. For example, the reflector 30 may be formed of an organic polymer material having reflectivity. In order for the organic polymer to exhibit reflectivity, the organic polymer may be composed of a single layer or multiple layers, and at least one of the single layer or multiple layers can be drawn, pulled, stretched and expanded. Further, the organic polymer may have polymer nodes linked to each other by fibrils that form fine porous vacancies. There are various organic polymer materials having such a structure and reflectivity and, for example, Teflon® may be used. By way of example, the reflector 30 may be formed of a polytetrafluoroethylene resin that can be drawn and expanded.

Figure 3:
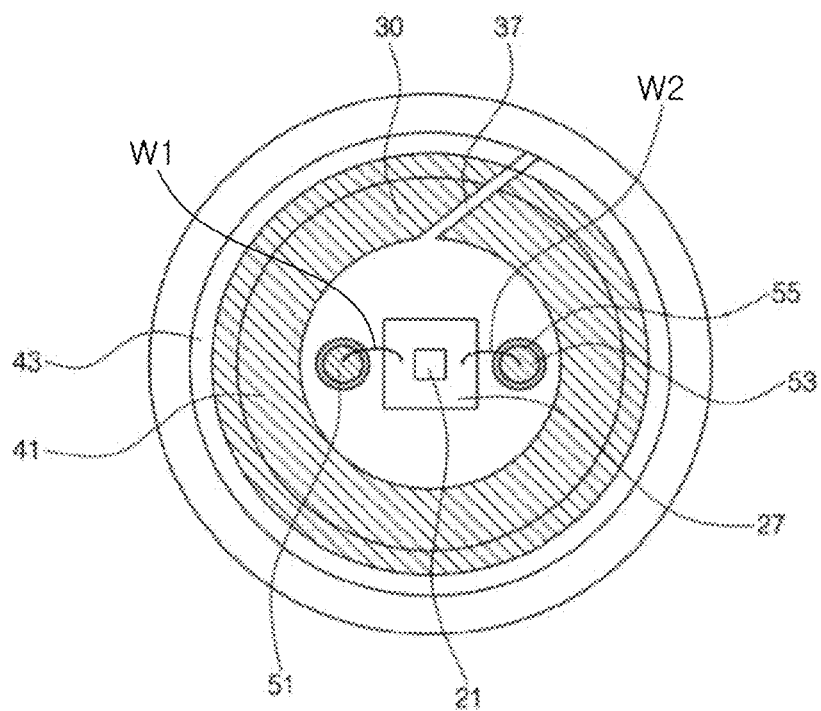
FIG. 3 is a plan view of the light-emitting device package according to the embodiment of the present disclosure.

In one embodiment, the reflector 30 has a slit 37 formed by removing a portion of the reflector 30 to impart elasticity to the reflector 30, as shown in FIGS. 2-3. The slit 37 is disposed at one side of the reflector 30 to divide the reflector 30. With this structure, the reflector 30 has a continuous ring shape other than the slit 37 and has both ends divided by the slit 37 and facing each other via the slit 37. In some embodiments, both ends of the reflector 30 may contact each other. In other embodiments, both ends may be separated by a predetermined distance from each other. The reflector 30 has elasticity imparted by the slit 37 and is manufactured, with both ends of the reflector 30 separated from each other, such that the outer diameter of the reflector 30 can be changed by force applied inwards from both ends of the reflector 40. This structure will be described below.

In some embodiments, the slit 37 may be disposed on a line passing through the center of the shape defined by the reflector 30. For example, for the reflector 30 having a circular shape, the slit 37 may be disposed on a line extending outwards from the center of the circular shape. However, it should be understood that the shape of the slit 37 is not limited thereto and may be changed in various ways so long as the slit can stably impart certain elasticity to the reflector 30 while maximizing reflectivity of the reflector 30.

FIG. 3 is a plan view of the light-emitting device package 100 according to the embodiment of the present disclosure, in which the slit 37 has a different shape. Referring to FIG. 3, the slit 37 may be obliquely disposed with respect to the line passing through the center of the circular shape defined by the reflector 30. Since both ends of the slit 37 facing each other are obliquely disposed and have a larger area than a slit formed along a straight line, distortion of both ends of the slit 37 can be suppressed, thereby providing a stable ring shape.

Referring again to FIG. 1 and FIG. 2, the cover 43 is disposed along a side of the reflector 30, that is, along the circumference of the reflector 30. The cover 43 surrounds the outer surface of the reflector 30 and is open at upper and lower sides thereof.

The cover 43 is disposed along the circumference of the reflector 30 and is attached to the substrate 10 while supporting a window 41. The cover 43 may be formed of various materials, for example, a metal. In addition to aluminum and/or an aluminum alloy, the cover 43 may be formed of a material having high reflectivity, for example, various metals including silver, gold, tin, copper, chromium, nickel, molybdenum, titanium, and the like, and/or alloys thereof. Alternatively, the cover 43 may be formed of other materials, for example, an organic polymer, which is coated with a metal or a metal alloy.

An upper end of the cover 43 may partially extend in a direction parallel to the surface of the substrate 10 and may be provided at an extended portion thereof with a step (not shown) for mounting the window 41. The step of the cover 43 may be provided corresponding to a thickness of the window 41. A bonding agent may be disposed between the step of the cover 43 and the window 41 to attach the window 41 thereto.

A lower end of the cover 43 is provided to the surface of the substrate 10 and is connected to the substrate 10 via a coupling member 47 to seal an interior space. Here, the coupling member 47 may be realized in various ways so long as the coupling member 47 can connect the lower end of the cover 43 to the substrate 10 to seal the interior space. For example, in some embodiments, the cover 43 may be formed of a metal and the coupling member 47 may be a welding portion at which the cover 43 is welded to the substrate 10. In this embodiment, the lower end of the cover 43 may be sealed by welding.

In one embodiment, an inner diameter C1 of the cover 43 is substantially the same as the outer diameter D2 of the reflector 30. As a result, the entirety of the inner surface of the cover 43 contacts the outer surface 33 of the reflector 30, as shown in FIG. 1.

The cover 43 may be provided at an upper side thereof with the window 41 in a region thereof corresponding to an upper portion of the light-emitting diode chip 21 to allow light emitted from the light-emitting diode chip 21 to pass therethrough.

The window 41 is disposed in the region of the cover 43 corresponding to the upper portion of the light-emitting diode chip 21 to allow light emitted from the light-emitting diode chip 21 to pass therethrough.

The window 41 may protect the light-emitting diode chip 21 inside the opening OPN. The window 41 may have various shapes so as to allow light emitted from the light-emitting diode chip 21 to pass therethrough or so as to change a path of the light emitted from the light-emitting diode chip 21. Collection or dispersion of light may be required depending upon the purpose of the light-emitting device package 100 according to the embodiment of the present disclosure and the window 41 may be applied, structured and/or configured as needed according to such a purpose.

The window 41 is formed of a transparent insulating material to allow the light emitted from the light-emitting diode chip 21 to pass therethrough and protects the light-emitting diode chip 21 while allowing the light emitted from the light-emitting diode chip 21 to pass therethrough. The window 41 may be formed of a material that can prevent deformation or discoloration due to the light emitted from the light-emitting diode chip 21. For example, when the light emitted from the light-emitting diode chip 21 is UV light, the window 41 may be formed of a material that can prevent deformation or discoloration due to UV light. The window 41 may be formed of various materials without being limited to a particular material so long as the window can satisfy the above functions. For example, the window 41 may be formed of quartz or an organic polymer material. Here, since the wavelength of light absorbed by or transmitted through the organic polymer material differs depending upon the kinds of monomers and molding methods and conditions, the organic polymer material may be selected in consideration of the wavelength of light emitted from the light-emitting diode chip 21. For example, organic polymer materials such as poly(methyl methacrylate) (PMMA), polyvinyl alcohol (PVA), polypropylene (PP), and low density polyethylene (PE) absorb substantially no UV light, whereas an organic polymer such as polyesters can absorb UV light.

Although the window 41 is illustrated as disposed above the light-emitting diode chip 21 to be separated from the light-emitting diode chip 21 in this embodiment, it should be understood that other implementations are possible and the window 41 can be modified in various ways so long as the window 41 allows efficient transmission of the light emitted from the light-emitting diode chip 21 therethrough. For example, the window 41 may be provided so as to fill the opening OPN of the reflector 30.

Figure 4A:
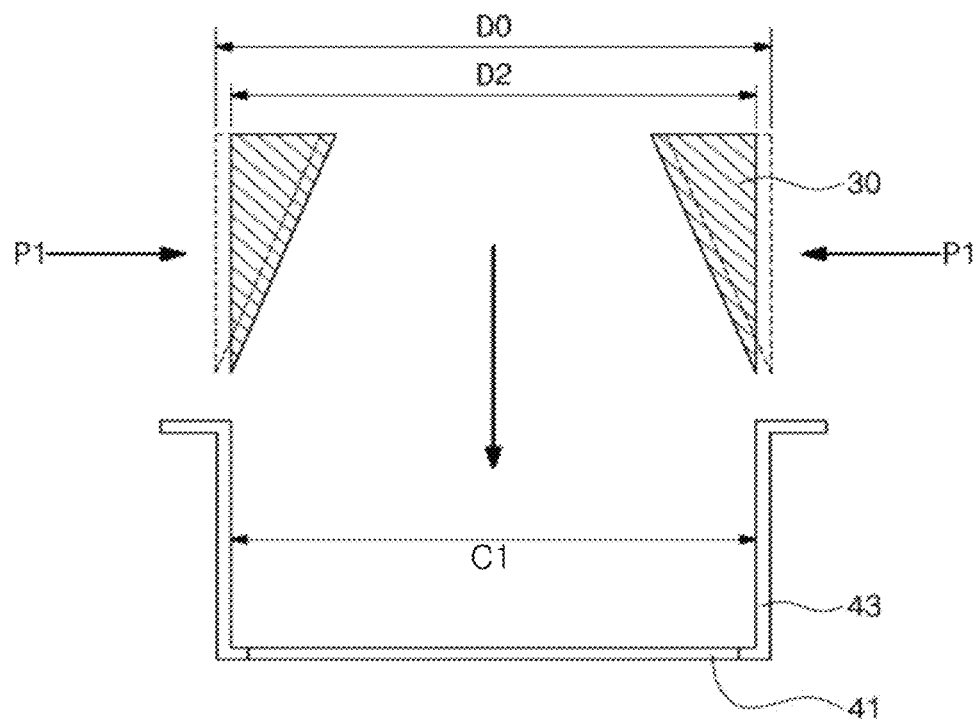
FIG. 4A to FIG. 4C are sectional view illustrating a method of manufacturing the light-emitting device package according to the embodiment of the present disclosure where.
Figure 4B:
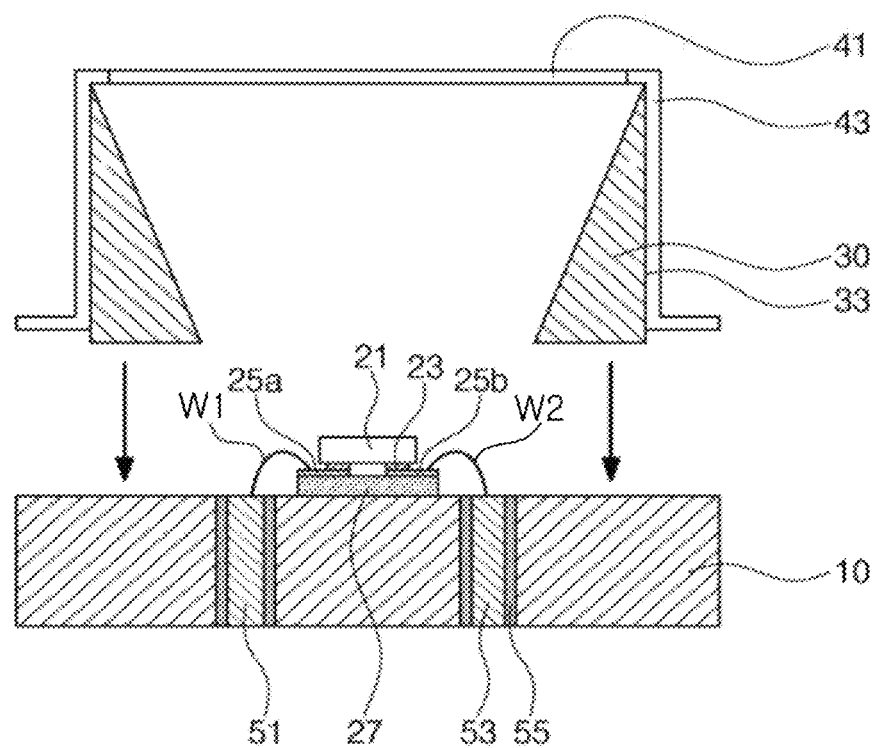
Figure 4C:
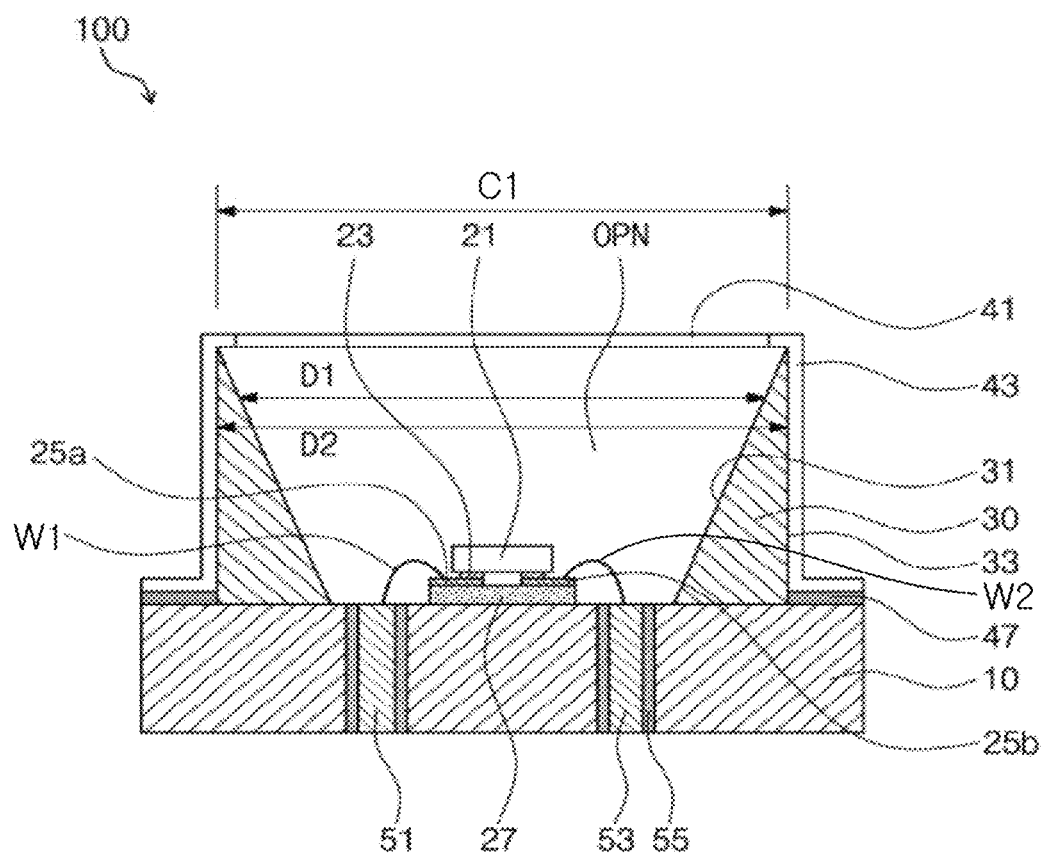

A method for manufacturing the light-emitting device package 100 having the above structure is described according to FIGS. 4A through 4C. FIG. 4A to FIG. 4C are sectional views illustrating the method of manufacturing the light-emitting device package according to embodiments of the present disclosure.

Referring to FIG. 4A, a cover 43 and a reflector 30 are prepared and assembled to each other.

The reflector 30 has a slit 37 (see FIG. 2) formed by partially removing a portion of the reflector 30. Both ends of the reflector 30 divided by the slit 37 are separated a predetermined distance from each other. Since both ends of the reflector 30 are separated by a predetermined distance from each other via the slit 37, an outer diameter of the reflector 30 can be reduced through the decrease in distance between both ends of the reflector 30 when force is applied inwardly to the reflector 30 at both sides thereof. If the force applied inwardly to the reflector 30 at both sides thereof is released, the reflector 30 returns to an initial diameter due to elasticity of the reflector 30. As shown in FIG. 4A, when the initial diameter of the reflector 30, i.e., not exposed to external force, is referred to as a first diameter D0 and the diameter of the reflector 30 exposed to external force P1 applied inwardly at both sides thereof is referred to as a second diameter D2, the second diameter D2 is smaller than the first diameter D0. The decrease in diameter may differ depending upon the magnitude of the external force P1 and the width of the slit 37.

The reflector 30 is inserted into the cover 43 by applying external force P1 to the reflector 30. Upon insertion of the reflector 30 into the cover 43, the reflector 30 may be inserted downwardly into the cover 43 from an upper portion of the cover 43, with the cover 43 disposed to be vertically penetrated, as shown in FIG. 4A. Here, a lower surface of the reflector 30 is disposed at the upper side of the cover as shown in FIG. 4A.

However, it should be understood that this insertion method is described by way of example. Alternatively, with the cover 43 disposed to have the opening (OPN), the reflector 30 is inserted into the cover 43 through the opening by upwardly applying force to the reflector 30 at a lower side of the cover 43. The cover 43 may be assembled to the reflector 30 by fitting the cover 43 to the reflector 30 in a secured state.

Here, the second diameter D2 of the reflector 30 is smaller than or equal to the inner diameter C1 of the cover 43 in order to allow the reflector 30 to be easily inserted into the cover 43. The reflector 30 can be easily inserted into the cover 43 when the second diameter D2 of the reflector 30 is smaller than the inner diameter C1 of the cover 43.

When the reflector 30 is completely inserted into the cover, the external force P1 applied to the reflector 30 is released. When the force applied to the reflector 30 is released, restoration force acts on the reflector 30. As a result, the reflector 30 is secured to the cover 43 in a stable and tight manner. Next, referring to FIG. 4B, a substrate 10 having a light-emitting diode chip 21 mounted thereon is provided and an assembly of the reflector 30 and the cover 43 is disposed on the substrate 10.

The light-emitting diode chip 21 may be first mounted on a sub-mount 27. The light-emitting diode chip 21 mounted on the sub-mount 27 may be disposed on the substrate 10 having first and second terminal 51, 53 through wire bonding using W1 and W2, as shown in FIG. 4B. Although not shown in the drawings, a bonding agent may be disposed between the sub-mount 27 and the substrate 10.

After assembly of the reflector 30 and the cover 43 is rotated in a direction in which the opening of the reflector 30 is gradually widened, the assembly of the reflector 30 and the cover 43 may be disposed on the substrate 10 as shown in FIG. 4B. Here, the reflector 30 surrounds the circumference of the light-emitting diode chip 21 and is disposed such that the light-emitting diode chip 21 is placed in the opening OPN of the reflector 30. According to this embodiment, since the reflector 30 is tightly secured to the cover 43 and can be stably disposed on the substrate 10, a bonding agent may be omitted between the reflector 30 and the substrate 10. However, it should be noted that the bonding agent may be disposed to more tightly secure the reflector 30 to the substrate 10 in other embodiments.

Next, as shown in FIG. 4C, a gap between the cover 43 and the substrate 10 is sealed. A lower end of the cover 43 is coupled to the substrate 10 by welding to seal the gap therebetween, thereby completing the light-emitting device package 100 according to the embodiment of the present disclosure.

In one embodiment, the step of preparing the cover 43, the step of preparing the reflector 30, and the step of preparing the substrate 10 or a light emitting device is not performed according to a particular sequence, and the light-emitting device package 100 may be manufactured by individually preparing the cover 43, the reflector 30, the substrate 10 and the light emitting device, followed by mounting or assembling these components.

Although the cover 43 is first coupled to the window 41 and the reflector 30 is then mounted on the cover 43 in this embodiment, it should be understood that other implementations are possible. The sequence of coupling the cover 43 and the window 41 may be changed in various ways. For example, after the cover 43 is assembled to the reflector 30, the window 41 may be connected to the cover 43 before assembly of the cover 43 and the reflector 30 is mounted on the substrate 10. Alternatively, the cover 43 may be first assembled to the reflector 30 and the assembly of the cover 43 and the reflector 30 may be mounted on the substrate 10, followed by connecting the window 41 to the cover 43.

Although the method of manufacturing one light-emitting device package 100 is illustrated in FIG. 4A to FIG. 4C, it should be understood that other implementations are possible. According to some embodiments, multiple light-emitting device packages 100 can be simultaneously manufactured through batch production.

For example, assemblies of the reflectors 30 and the covers 43 may be formed by arranging multiple covers 43 in a matrix, followed by simultaneously or sequentially inserting the reflectors 30 into the covers 43. In addition, multiple substrates 10 each having the light-emitting diode chip 21 mounted thereon may be prepared and arranged in a matrix, and the assemblies of the reflectors 30 and the covers 43 may be assembled and welded to the substrates 10 to cover the light-emitting diode chips 21, thereby manufacturing multiple light-emitting device packages 100. Alternatively, a cover 43 or a substrate 10 not divided and having a broad area is prepared for individual light-emitting device packages 100, and the reflector 30 is inserted into each cover, followed by cutting, thereby manufacturing multiple light-emitting device packages 100.

The light-emitting device package 100 according to the embodiments described above has high durability through stable and tight assembly between components thereof.

According to the embodiments described above, the reflector 30 is tightly fastened to the cover 43, thereby suppressing separation of the reflector 30 inside the light-emitting device package 100. In particular, when there is a difference in diameter between the cover 43 and the reflector 30, a space is formed between the cover 43 and the reflector 30. If the reflector 30 may not be firmly secured to the cover 43, the reflector 30 may move into the space between the cover 43 and the reflector 30. In addition, when the reflector 30 is not firmly secured to the substrate 10, the reflector 30 can be separated from the substrate 10 and unexpectedly moved into the space, potentially causing rattling of the reflector 30 inside the light-emitting device package 100. The reflector 30, if moving inside the cover 43, may damage other components, for example, the light-emitting diode chip 21 or the wires W1 and W2. In the related art, in order to address possible movement of the reflector 30, a separate bonding agent is required to secure the reflector 30 and the cover 43 and a separate process of securing the reflector 30 to the cover 43 using the bonding agent is further added. Nevertheless, in use, the bonding agent can wear off and fall out due to external impact or curing of the bonding agent over time, thereby causing separation of the reflector 30 from the cover 43 again.

However, according to the embodiments of the present disclosure, the reflector 30 is stably provided to the cover 43 through simple insertion without a separate process, thereby preventing the aforementioned problem. In particular, the reflector 30 is formed to have elasticity and stably secured to the cover 43 using elasticity thereof. As a result, the light-emitting device package according to the embodiment may not use a separate bonding agent between the reflector 30 and the cover 43, and the assembly of the reflector 30 and the cover 43 is completed simply by inserting the reflector 30 into the cover 43. In the embodiments of the present disclosure, the step of bonding the reflector 30 to the cover 43 using the bonding agent and the step of curing the bonding agent are omitted. As a result, the process of fastening the reflector 30 to the cover 43 becomes very easy and simple, and assembly of the light-emitting device package can achieve reduction in a defect rate while improving a manufacturing yield.

The light-emitting device package having the above structure may be modified in various shapes in order to improve light extraction efficiency or workability.

FIG. 5 to FIG. 8 are sectional views of light-emitting device packages according to embodiments of the present disclosure. In order to avoid repetition, the following description will focus on different features from the above embodiments and, for details of components not described herein, reference to the description of the above embodiments can be made.

Figure 5:
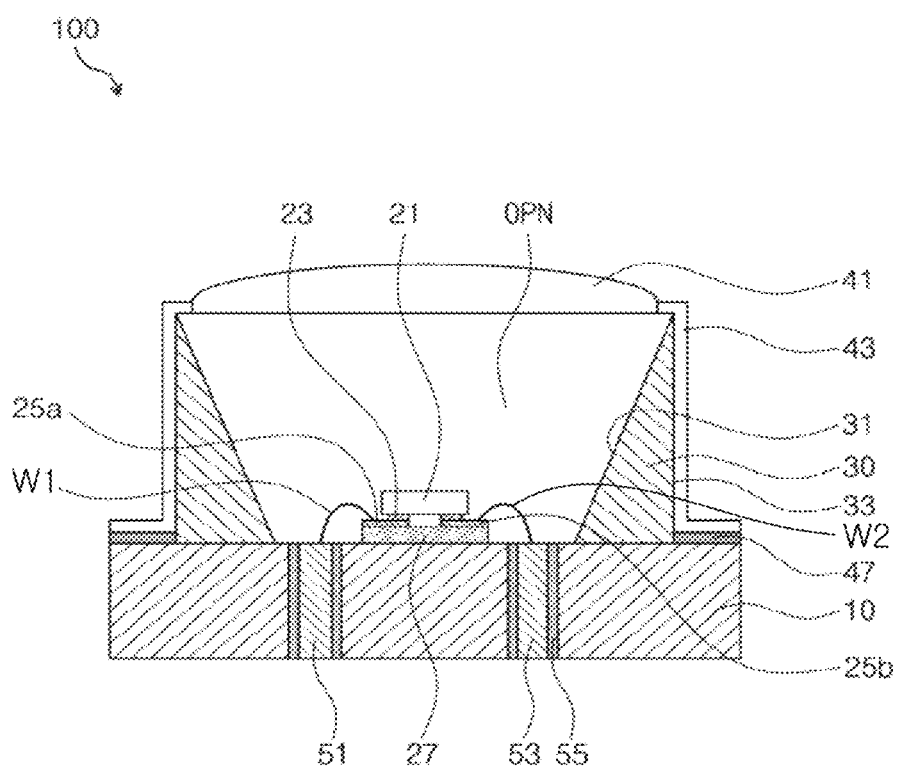
FIG. 5 is a sectional view of a light-emitting device package having a convex lens shaped window according to another embodiment of the present disclosure.

Referring to FIG. 5, the window 41 may have a simple plate shape instead of a lens shape, as described above, or may have a convex lens shape or a concave lens shape. For example, the window 41 may have various shapes, such as a spherical shape, an elliptical shape, a hemispherical shape, a semi-elliptical shape, a bifocal shape, and the like. Referring to FIG. 5, the window 41 having a convex lens shape with a flat lower surface is shown by way of example. According to the embodiment of the present disclosure, the shape of the window 41 may be modified to adjust the path of light emitted from the light-emitting diode chip 21 to achieve, for example, collection or dispersion of the light.

Figure 6:
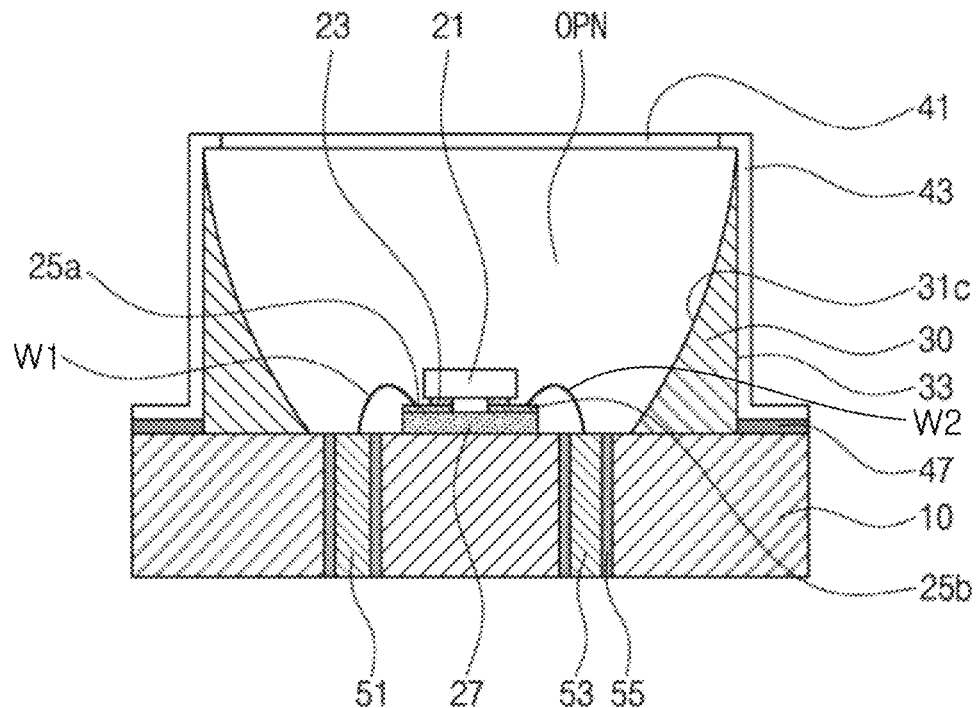
FIG. 6 is a sectional view of a light-emitting device package having a curved inner surface of a reflector according to further another embodiment of the present disclosure.

Referring to FIG. 6, the reflector 30 may include an inner surface 31 facing the opening OPN, an outer surface 33 facing outwards, and a lower surface adjoining the upper surface of the substrate 10, in which the inner surface 31 of the reflector 30 according to the embodiment may be a curved surface. The curved surface may have various curvatures depending upon a profile of light emitted from the light-emitting diode chip 21. For example, when the light-emitting diode chip 21 is configured to emit a larger quantity of light in an upward direction or in a lateral direction, the inner surface 31 may have different curvatures depending upon locations thereof.

In one embodiment, the inner surface 31 of the reflector 30 may be a parabolic surface and the light emitting diode may be disposed at a focal point of the elliptical surface. In other words, in a cross-sectional view of the reflector 30, a side of the reflector 30 corresponding to the inner surface 31 may define a parabolic shape and the light emitting diode may be disposed at the focal point of the parabolic shape. In this embodiment, among light emitted from the light emitting diode, light reflected by the inner surface 31 of the reflector 30 may travel upwards.

Although the inner surface 31 has a curved surface in this embodiment, the shape of the inner surface 31 is not limited thereto. The inner surface 31 may be a combination of at least one curved surface and at least one flat surface, in which an inclination of the flat surface or the curvature of the curved surface may be set in various ways.

Figure 7:
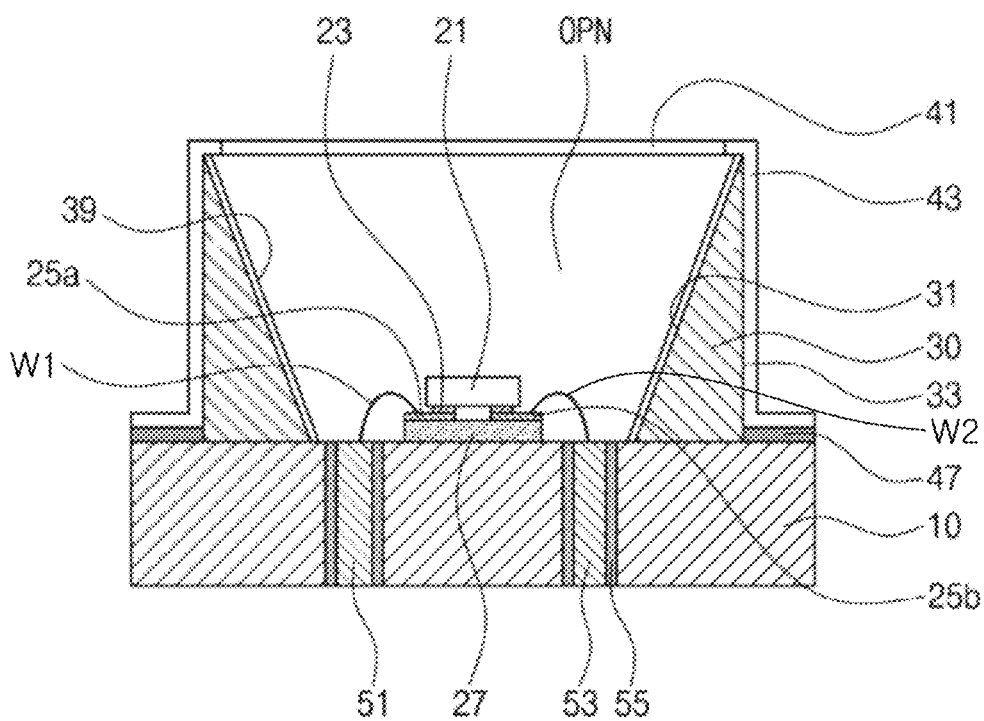
FIG. 7 is a sectional view of a light-emitting device package having a reflector with a reflective film according to one embodiment of the present disclosure.

Referring to FIG. 7, the reflector 30 may include a reflective film 39 in order to improve reflectivity. The reflective film 39 may be plated or coated with a material having high reflectivity with respect to light emitted from the light-emitting diode chip 21. Although the reflector 30 may have the reflective film 39 over the entire surface thereof, the reflective film 39 may be provided to the inner surface 31 of the reflector 30, by which light is substantially reflected.

In the structure wherein the reflector 30 includes the reflective film 39, a portion of the reflector 30 other than the reflective film 39 may be formed of a metal, a ceramic material, or an organic polymer. For example, organic polymers, such as polycarbonate (PC), polyether sulfone, triacetylcellulose (TAC), poly(methyl methacrylate) (PMMA), polyvinyl alcohol (PVA), polyimide (PI), cyclic olefin copolymer (COC), Teflon®, polytetrafluoroethylene (ePTFE), and the like, may be used. Here, among materials for the reflector 30, a material capable of enduring heat or UV light emitted from the light-emitting diode chip 21 may be selected.

In addition to aluminum and/or aluminum alloys, the reflective film 39 may be formed of other materials having high reflectivity, for example, various metals, such as silver, gold, tin, copper, chromium, nickel, molybdenum, titanium, and the like, and alloys thereof, or reflective organic polymers.

In one embodiment, the reflector 30 and/or the reflective film 39 may have roughness to improve light emission efficiency through improvement in scattering of light emitted from the light-emitting diode chip 21. In particular, roughness may be provided to an inclined inner surface of the reflector 30 and/or the reflective film 39 and may be further added to the upper surface of the substrate 10, as needed.

Figure 8:
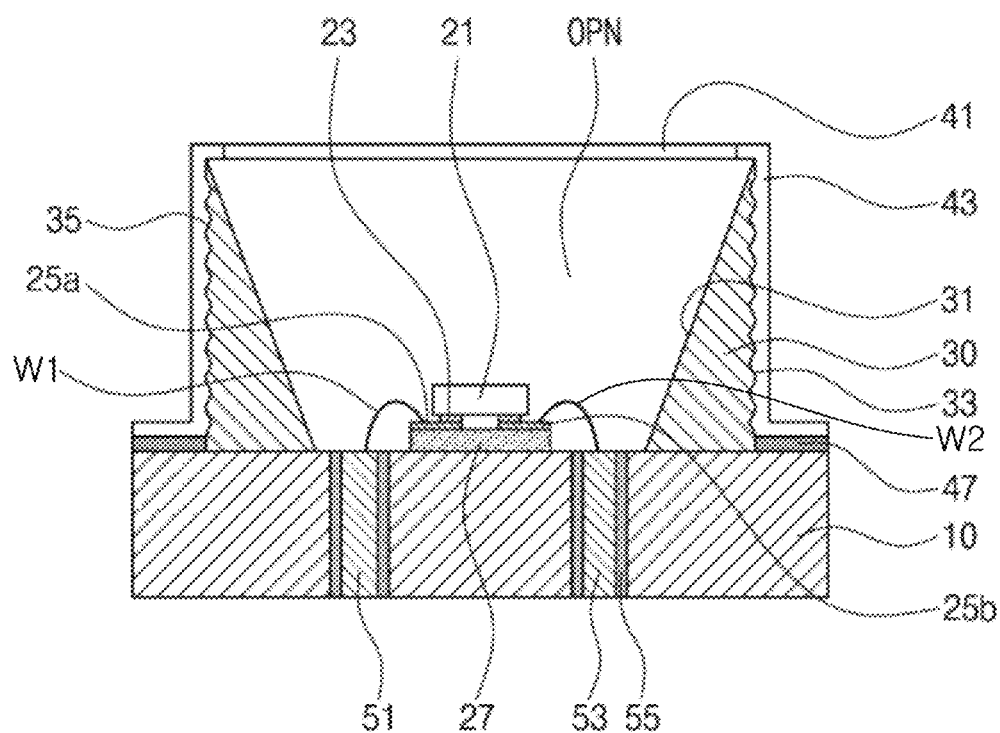
FIG. 8 is a sectional view of a light-emitting device package having a reflector with fastening members according to further another embodiment of the present disclosure.

Referring to FIG. 8, the cover 43 and the reflector 30 may be provided with fastening members for enhancement of assembly. For example, the cover 43 and the reflector 30 may be provided with threads formed on surfaces thereof facing each other to engage each other. The threads 35 of the cover 43 may be engaged with the threads 35 of the reflector 30.

As a result, the cover 43 can be more firmly fastened to the reflector 30. In some embodiments, the light-emitting device package may be applied to various light irradiation apparatuses, for example, a UV curing machine, a sterilizer, and the like. In this case, the light irradiation apparatus includes at least one light-emitting device package and a main body on which the at least one light-emitting device package is mounted. The main body may be further provided with a power supply for supplying electric power, a controller for controlling the quantity of light emitted from the light-emitting device package, and the like.

Although some exemplary embodiments have been described herein, it should be understood by those skilled in the art that these embodiments are given by way of example only, and that various modifications, variations, and alterations can be made without departing from the spirit and scope of the present disclosure.

Therefore, the scope of the present disclosure should be interpreted according to the following appended claims and equivalents thereto.

What is claimed is:

1. A light-emitting device package comprising:
   a substrate having a mounting region;
   a light-emitting diode chip mounted in the mounting region of the substrate;
   a reflector disposed to surround the light-emitting diode chip and having an opening through which the mounting region of the substrate is exposed, the reflector being structured to have a varying diameter in response to an applied force; and
   a cover enclosing the reflector, wherein an inner diameter of the cover is smaller than an initial diameter of the reflector without the applied force, and wherein the cover counteracts a restoration force acting on the reflector, wherein the restoration force attempts to restore the reflector to the initial diameter.

2. The light-emitting device package according to claim 1, wherein an inner surface of the reflector defining the opening of the reflector is an inclined surface.

3. The light-emitting device package according to claim 1, wherein the inner surface of the reflector defining the opening of the reflector has a parabolic cross-section shape.

4. The light-emitting device package according to claim 3, wherein the light-emitting diode chip is disposed at a focal point of the parabolic cross-section shape.

5. The light-emitting device package according to claim 1, wherein the reflector has a ring shape that surrounds the light-emitting diode chip.

6. The light-emitting device package according to claim 5, wherein the reflector is discontinuous via a slit formed by removing a portion of the reflector, the reflector having both ends separated from each other by the slit.

7. The light-emitting device package according to claim 6, wherein the slit is placed on a line passing through a center of the ring or is slanted with respect to the line.

8. The light-emitting device package according to claim 1, wherein the reflector includes an elastic material.

9. The light-emitting device package according to claim 8, wherein the reflector has an outer wall contacting an inner surface of the cover and the outer wall of the reflector is fastened to the inner surface of the cover.

10. The light-emitting device package according to claim 9, wherein both the outer wall of the reflector and the inner surface of the cover have threads engaging with each other.

11. The light-emitting device package according to claim 1, further comprising:
    a reflective film formed on an inner surface of the reflector.

12. The light-emitting device package according to claim 1, further comprising:
    a window connected to the cover and allowing light emitted from the light-emitting diode chip to pass therethrough,
    wherein the window covers the opening of the reflector.

13. The light-emitting device package according to claim 12, wherein the window fills the opening of the reflector.

14. A light irradiation apparatus comprising:
    at least one light-emitting device package; and
    a main body on which the at least one light-emitting device package is mounted,
    wherein the light-emitting device package comprises:
    a substrate having a mounting region;
    a light-emitting diode chip being mounted in the mounting region on the substrate;
    a reflector disposed to surround the light-emitting diode chip and having an opening through which the mounting region of the substrate is exposed, the reflector being structured to have a varying diameter in response to an applied force; and a cover enclosing the reflector, wherein an inner diameter of the cover is smaller than an initial diameter of the reflector without the applied force, and wherein the cover counteracts a restoration force acting on the reflector, wherein the restoration force attempts to restore the reflector to the initial diameter.

15. The light irradiation apparatus according to claim 14, wherein an inner surface of the reflector defining the opening is inclined, and the varying diameter of the reflector includes a first diameter and a second diameter, wherein the first diameter is smaller than an inner diameter of the cover and the second diameter is equal to the inner diameter of the cover.

16. The light irradiation apparatus according to claim 15, wherein the reflector has a discontinuous ring shaped body and a slit, the slit is formed by removing a portion of the reflector; and the ring shaped body has both ends facing each other via the slit and separated by the slit.

17. A light-emitting device package comprising:

a substrate having a mounting region;

a light-emitting diode chip mounted in the mounting region of the substrate;

a reflector disposed to surround the light-emitting diode chip and having an opening through which the mounting region of the substrate is exposed, the reflector being structured to have a varying diameter in response to an applied force, wherein the reflector includes a slit slanted with respect to a line passing through a center of the opening; and a cover enclosing the reflector, wherein an inner diameter of the cover is smaller than an initial diameter of the reflector without the applied force.

18. The light-emitting device package of claim 17, wherein a restoration force acting on the reflector is counteracted by the cover.

19. The light-emitting device package according to claim 17, further comprising a reflective film formed on an inner surface of the reflector.

20. The light-emitting device package according to claim 17, further comprising a window connected to the cover and allowing light to pass therethrough, wherein the window covers the opening of the reflector.

* * * * *